(12) United States Patent
Kameyama et al.

(10) Patent No.: US 7,582,971 B2
(45) Date of Patent: Sep. 1, 2009

(54) SEMICONDUCTOR DEVICE AND MANUFACTURING METHOD OF THE SAME

(75) Inventors: Kojiro Kameyama, Ota (JP); Akira Suzuki, Ota (JP); Mitsuo Umemoto, Gunma (JP)

(73) Assignees: Sanyo Electric Co., Ltd., Osaka (JP); Kanto Sanyo Semiconductor Co., Ltd., Gunma (JP)

( * ) Notice: Subject to any disclaimer, the term of this patent is extended or adjusted under 35 U.S.C. 154(b) by 282 days.

(21) Appl. No.: 11/257,406

(22) Filed: Oct. 25, 2005

(65) Prior Publication Data

US 2006/0087042 A1  Apr. 27, 2006

(30) Foreign Application Priority Data

Oct. 26, 2004  (JP)  ............................. 2004-310725
Oct. 28, 2004  (JP)  ............................. 2004-313734

(51) Int. Cl.
*H01L 23/48* (2006.01)
*H01L 23/52* (2006.01)
*H01L 29/40* (2006.01)

(52) U.S. Cl. ...................... 257/774; 257/775; 257/784; 257/780

(58) Field of Classification Search ................. 257/774, 257/775, 780, 781, 768, 784, 734, 758, 760
See application file for complete search history.

(56) References Cited

U.S. PATENT DOCUMENTS

| | | | |
|---|---|---|---|
| 4,097,890 A | 6/1978 | Morris et al. | |
| 5,056,216 A | 10/1991 | Madou et al. | |
| 5,149,674 A | 9/1992 | Freeman et al. | |
| 5,229,647 A * | 7/1993 | Gnadinger | ................. 257/785 |
| 5,397,907 A | 3/1995 | Lee | |

(Continued)

FOREIGN PATENT DOCUMENTS

EP    1376678 A2    1/2004

(Continued)

OTHER PUBLICATIONS

Microchip Fabrication, Peter Van Zant, McGraw-Hill, Fourth Edition, pp. 402-403.

(Continued)

*Primary Examiner*—Chuong A. Luu
(74) *Attorney, Agent, or Firm*—Morrison & Foerster LLP

(57) ABSTRACT

The invention is directed to a semiconductor device having a penetrating electrode and a manufacturing method thereof in which reliability and a yield of the semiconductor device are enhanced. A refractory metal layer is formed on a pad electrode formed on a semiconductor substrate with a first insulation film therebetween. Next, a passivation layer is formed on a front surface of the semiconductor substrate including on the pad electrode and on the refractory metal layer, and a supporting body is further formed with a resin layer therebetween. Next the semiconductor substrate is etched to form a via hole from a back surface of the semiconductor substrate to the pad electrode. Next, a penetrating electrode electrically connected with the pad electrode exposed at a bottom of the via hole and a wiring layer 21 are formed with a second insulation film therebetween. Furthermore, a solder resist layer and a conductive terminal are formed. Finally, the semiconductor substrate is cut and separated into semiconductor dies by dicing.

10 Claims, 14 Drawing Sheets

U.S. PATENT DOCUMENTS

| | | | |
|---|---|---|---|
| 5,432,119 | A | 7/1995 | Le et al. |
| 5,910,687 | A * | 6/1999 | Chen et al. .................. 257/784 |
| 5,949,140 | A | 9/1999 | Nishi et al. |
| 5,985,749 | A | 11/1999 | Lin et al. |
| 6,031,293 | A | 2/2000 | Hsuan et al. |
| 6,204,074 | B1 | 3/2001 | Bertolet et al. |
| 6,562,709 | B1 * | 5/2003 | Lin ........................... 438/618 |
| 6,667,551 | B2 * | 12/2003 | Hanaoka et al. ............. 257/750 |
| 6,720,661 | B2 | 4/2004 | Hanaoka et al. |
| 6,746,953 | B2 | 6/2004 | Kramer et al. |
| 6,768,205 | B2 | 7/2004 | Taniguchi et al. |
| 6,773,952 | B2 | 8/2004 | Armbrust et al. |
| 6,943,442 | B2 | 9/2005 | Sunohara et al. |
| 7,045,896 | B2 | 5/2006 | Ahn |
| 7,094,701 | B2 | 8/2006 | Umemoto et al. |
| 7,101,735 | B2 | 9/2006 | Noma et al. |
| 7,214,615 | B2 | 5/2007 | Miyazama |
| 7,247,939 | B2 | 7/2007 | Huang et al. |
| 2002/0025587 | A1 | 2/2002 | Wada |
| 2003/0025173 | A1 | 2/2003 | Suminoe et al. |
| 2003/0045085 | A1 | 3/2003 | Taniguchi et al. |
| 2003/0137056 | A1 | 7/2003 | Taniguchi et al. |
| 2003/0230805 | A1 | 12/2003 | Noma et al. |
| 2004/0016942 | A1 | 1/2004 | Miyazawa et al. |
| 2004/0017419 | A1 | 1/2004 | Lai et al. |
| 2004/0045668 | A1 | 3/2004 | Iwasaki et al. |
| 2004/0072413 | A1 | 4/2004 | Hashimoto et al. |
| 2004/0137723 | A1 | 7/2004 | Noma et al. |
| 2004/0140563 | A1 | 7/2004 | Ahn |
| 2004/0188807 | A1 | 9/2004 | Hiraoka et al. |
| 2004/0251554 | A1 | 12/2004 | Masuda |
| 2005/0167812 | A1 | 8/2005 | Yoshida et al. |
| 2005/0189637 | A1 | 9/2005 | Okayama et al. |
| 2006/0033168 | A1 | 2/2006 | Umemoto et al. |
| 2006/0108691 | A1 | 5/2006 | Kameyama et al. |
| 2006/0108695 | A1 | 5/2006 | Kameyama et al. |
| 2006/0202348 | A1 | 9/2006 | Kameyama et al. |
| 2008/0132038 | A1 | 6/2008 | Kameyama et al. |

FOREIGN PATENT DOCUMENTS

| | | |
|---|---|---|
| EP | 1376678 A3 | 1/2004 |
| EP | 1439576 | 7/2004 |
| EP | 1 564 805 A1 | 8/2005 |
| JP | 2002-512436 A1 | 4/2002 |
| JP | 2003-309221 | 10/2003 |
| JP | 2004-296488 | 10/2004 |
| JP | 2005-183548 | 7/2005 |
| WO | WO-96/13062 A1 | 5/1996 |
| WO | WO-99/40624 A1 | 8/1999 |
| WO | WO 2004/064159 | 7/2004 |

OTHER PUBLICATIONS

European Search Report, dated Apr. 24, 2009, directed to counterpart European Patent Application No. 05023408.7; (5 pages.).

European Search Report, dated May 8, 2009, directed to related European Patent Application No. 05023409.5; (5 pages.).

Kameyama et al., US Office Action mailed Apr. 23, 2009, directed to related application 11/969,065; (7 pages.).

Kameyama et al., US Office Action mailed Jun. 8, 2009, directed to related application 12/346,667; (12 pages.).

* cited by examiner

SEMICONDUCTOR DEVICE AND MANUFACTURING METHOD OF THE SAME

CROSS-REFERENCE OF THE INVENTION

This invention is based on Japanese Patent Applications Nos. 2004-310725 and 2004-313734, the content of which is incorporated by reference in its entirety.

BACKGROUND OF THE INVENTION

1. Field of the Invention

The invention relates to a semiconductor device and a manufacturing method thereof, particularly, a semiconductor device having a penetrating electrode and a manufacturing method thereof.

2. Description of the Related Art

CSP (Chip Size Package) has received attention in recent years as a three-dimensional mounting technology as well as a new packaging technology. The CSP means a small package having almost the same outside dimensions as those of a semiconductor die packaged in it.

Conventionally, BGA (Ball Grid Array) type semiconductor devices having penetrating electrodes have been known as a kind of CSP. This BGA type semiconductor device has a penetrating electrode penetrating a semiconductor substrate and connected with a pad electrode. In this BGA type semiconductor device, a plurality of ball-shaped conductive terminals made of metal such as solder is arrayed in a grid pattern on a back surface of the device.

When this semiconductor device is mounted on electronic equipment, the ball-shaped conductive terminals are connected to wiring patterns on a circuit board (e.g. printed board). Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides.

Next a conventional manufacturing method of the BGA-type semiconductor device having the penetrating electrode will briefly described. First, on a front surface of a semiconductor substrate formed with a pad electrode with a first insulation film therebetween, a supporting body is attached with a resin layer therebetween. The attachment of this supporting body is performed according to needs, and not necessarily performed. Next, a via hole is formed from a back surface of the semiconductor substrate to the pad electrode by etching the semiconductor substrate. Furthermore, a second insulation film is formed on the back surface of the semiconductor substrate including in the via hole, exposing the pad electrode at a bottom of the via hole.

Furthermore, a penetrating electrode is formed on the second insulation film in the via hole, being electrically connected with the pad electrode exposed at the bottom. At the same time as this, a wiring layer is formed on the second insulation film on the back surface of the semiconductor substrate, being connected with the penetrating electrode. Then, a protection layer is formed on the back surface of the semiconductor substrate including on the wiring layer. Furthermore, a part of the protection layer may be opened to expose a part of the wiring layer, and a conductive terminal may be formed on this wiring layer. Then, the semiconductor substrate is cut and separated into a plurality of semiconductor dies by dicing. The relevant technology is disclosed in the Japanese Patent Application Publication No. 2003-309221.

Next, the above-described conventional semiconductor device manufacturing method will be partially described with reference to figures. FIGS. 27 and 28 are cross-sectional views showing the conventional semiconductor device manufacturing method.

In the conventional semiconductor device, as shown in FIG. 27, a pad electrode 52 is formed on a front surface of a semiconductor substrate 50 with an insulation film 51 therebetween in so-called front-end processes. Furthermore, in subsequent processes, a supporting body 56 is attached on the front surface of the semiconductor substrate 50 formed with the pad electrode 52 with a resin layer 55 therebetween. Thermal stresses (called residual stress or intrinsic stress) are likely to be generated in the pad electrode 52 when the pad electrode 52 is deposited.

However, as shown in FIG. 28, when the semiconductor substrate 50 is etched using the resist layer 60 as a mask to form a via hole 57 penetrating the semiconductor substrate 50, the pad electrode 52 at a bottom of the via hole 57 is deformed, projecting into the via hole 57, although it should be flat.

This deformation of the pad electrode 52 is caused by that the stress accumulated in the pad electrode 52 when the pad electrode 52 is deposited in the front-end processes loses its balance by a thermal load in a thermal cycle test and so on, and thus the stress is concentrated in the pad electrode 52 at the bottom of the via hole 57 so as to be released therefrom. Furthermore, the deformation of the pad electrode 52 also occurs after the insulation film 51 is etched.

Furthermore, after a penetrating electrode (not shown) formed of, for example, copper (Cu) is formed, being connected with the pad electrode 52 at the bottom of the via hole 57, the pad electrode 52 is deformed projecting on the back surface side of the semiconductor substrate 50 like being pulled by the penetrating electrode. This deformation is caused by a relation between residual stress accumulated in the penetrating electrode when the penetrating electrode is formed and the stress accumulated in the pad electrode 52.

Furthermore, the deformation of the pad electrode 52 described above sometimes causes damage or disconnection in the pad electrode 52 by metal fatigue. Therefore, after the penetrating electrode (not shown) formed of, for example, copper (Cu) is formed in the via hole 57 including on the deformed pad electrode 52, there sometimes occurs connection failure between the penetrating electrode and the pad electrode exposed in the via hole 57. That is, the deformation of the pad electrode 52 causes a problem of decreasing the reliability of the semiconductor device having the penetrating electrode. As a result, the reliability and yield of the semiconductor device having the penetrating electrode decreases.

SUMMARY OF THE INVENTION

The invention provides a semiconductor device that includes a semiconductor die, a pad electrode disposed on the front surface of the semiconductor die, a refractory metal layer disposed on the pad electrode and having a melting point higher than a melting point of the pad electrode, a first protection layer disposed on the front surface of the semiconductor die so that the refractory metal layer is placed between the pad electrode and the first protection layer, and a penetrating electrode disposed in a via hole and electrically connected with the pad electrode. The via hole is formed from the back surface of the semiconductor die toward the pad electrode.

The invention provides a method of manufacturing a semiconductor device. The method includes providing a semiconductor substrate having a pad electrode formed on the front surface thereof, forming a refractory metal layer on the pad electrode, forming a first protection layer on the front surface of the semiconductor substrate so that the refractory metal layer is placed between the pad electrode and the first protection layer; forming a via hole from the back surface of the semiconductor substrate toward the pad electrode, forming a penetrating electrode in the via hole so as to be electrically connected with the pad electrode, and cutting the semiconductor substrate to produce a semiconductor die.

The invention also provides a method of manufacturing a semiconductor device. The method includes providing a semiconductor substrate having a pad electrode formed on the front surface thereof and a refractory metal layer formed on the pad electrode, forming a via hole from the back surface of the semiconductor substrate toward the pad electrode, forming a penetrating electrode in the via hole so as to be electrically connected with the pad electrode, and separating the semiconductor substrate into a plurality of semiconductor dies.

The invention further provides a semiconductor device that includes a semiconductor die, a first insulation film disposed the front surface of the semiconductor die, a pad electrode disposed on part of the first insulation film, a second insulation film formed on the first insulation film so that an edge portion of the pad electrode is placed between the first and second insulation films, a first wiring layer in contact with the pad electrode through an opening formed in the second insulation film. The first wiring layer extends onto the second insulation film. The device also includes a penetrating electrode disposed in a via hole and electrically connected with the pad electrode. The via hole is formed from the back surface of the semiconductor die toward the pad electrode.

The invention provides another method of manufacturing a semiconductor device. The method includes providing a semiconductor substrate having a first insulation film disposed the front surface thereof, forming a pad electrode on the first insulation film, forming a second insulation film on the pad electrode and the first insulation film, forming an opening in the second insulation film to expose par of the pad electrode, forming a first wiring layer in the opening and on the second insulation film so that the first wiring layer is electrically connected with the pad electrode, forming a via hole from the back surface of the semiconductor substrate toward the pad electrode, forming in the via hole a penetrating electrode electrically connected with the pad electrode, and cutting the semiconductor substrate to produce a semiconductor die.

The invention also provides a method of manufacturing a semiconductor device. The method includes providing a semiconductor substrate having a pad electrode formed on the front surface thereof and an insulation film disposed on the front surface. The pad electrode is exposed through an opening formed in the insulation film, forming a via hole from the back surface of the semiconductor substrate toward the pad electrode, forming a penetrating electrode in the via hole so as to be electrically connected with the pad electrode, and separating the semiconductor substrate into a plurality of semiconductor dies.

DETAILED DESCRIPTION OF THE INVENTION

A semiconductor device manufacturing method of an embodiment of the invention will be described with reference to figures. FIGS. 1 to 13 are cross-sectional views showing the semiconductor device manufacturing method of the embodiment. FIGS. 1 to 13 show a portion of a semiconductor substrate near a dicing line (not shown).

Figure 1:
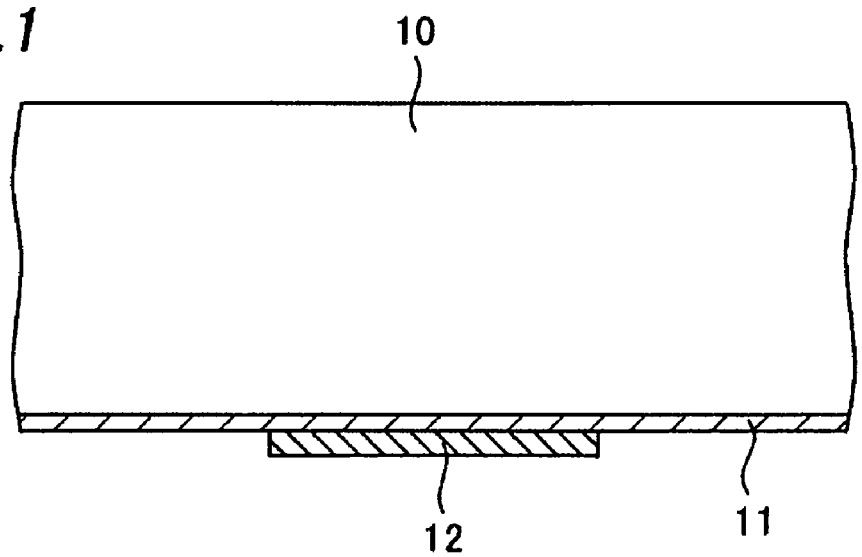
FIGS. 1 to 13 are cross-sectional views for explaining a semiconductor device manufacturing method of an embodiment of the invention.

First, as shown in FIG. 1, a semiconductor substrate 10 formed with an electronic device (not shown) on its front surface is prepared. The electronic device (not shown) is a light receiving element such as a CCD (Charge Coupled Device) or an infrared ray sensor, or a light emissive element, for example. Alternatively, the electronic device (not shown) can be the other electronic device than the light receiving element or the light emissive element. The semiconductor substrate 10 is formed of a silicon substrate, for example, but can be a substrate formed of the other material. The semiconductor substrate 10 preferably has a thickness of about 130 µm.

Next, a first insulation film 11 is formed as an interlayer insulation film on the front surface of the semiconductor substrate 10 including the electronic device (not shown). The first insulation film 11 is formed of, for example, a P-TEOS film or a BPSG film. The first insulation film 11 is formed by a CVD method to have a thickness of about 0.8 µm, preferably.

Next, a pad electrode 12 as an external connection electrode is formed on the first insulation film 11 on the front surface of the semiconductor substrate 10, being connected with the electronic device (not shown). The pad electrode 12 is formed of, for example, aluminum (Al), and preferably has a thickness of about 1 to 2 µm. At this time, the pad electrode 12 is deposited flat, and a predetermined amount of stress corresponding to a deposition condition is accumulated in the pad electrode 12.

Figure 2:
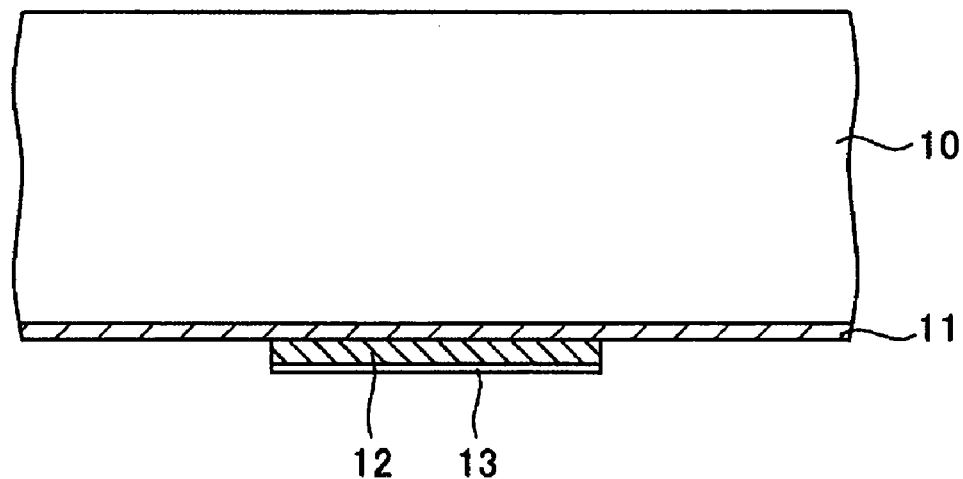

Next, as shown in FIG. 2, a refractory metal layer 13 is formed on the pad electrode 12. This refractory metal layer 13 has a function of attaching a passivation layer 14 as a first protection layer which will be described below to the pad electrode 12.

The refractory metal layer 13 is formed of a metal that can withstand a high temperature treatment, such as titanium (Ti), a titanium alloy, tantalum (Ta), a tantalum alloy, tungsten or a tungsten alloy. The titanium alloy forming the refractory metal layer 13 can be titanium nitride (TiN) or titanium tungsten (TiW), for example. The tantalum alloy can be tantalum nitride (TaN) or tantalum tungsten (TaW), for example. Alternatively, the refractory metal layer 13 can have a layered structure of these metals. Alternatively, the refractory metal layer 13 can be formed of the other metal than above as long as it has a function of attaching the passivation layer 14 which will be described below to the pad electrode 12.

In a case that the refractory metal layer 13 is formed of titanium (Ti), its thickness is preferably about 10 to 15 nm. In this case, it is preferable to use a sputtering method as a deposition method of the refractory metal layer 13. In a case that the refractory metal layer 13 is formed of titanium nitride (TiN), its thickness is preferably about 140 to 150 nm. In this case, it is preferable to use the sputtering method as the deposition method of the refractory metal layer 13.

Figure 3:
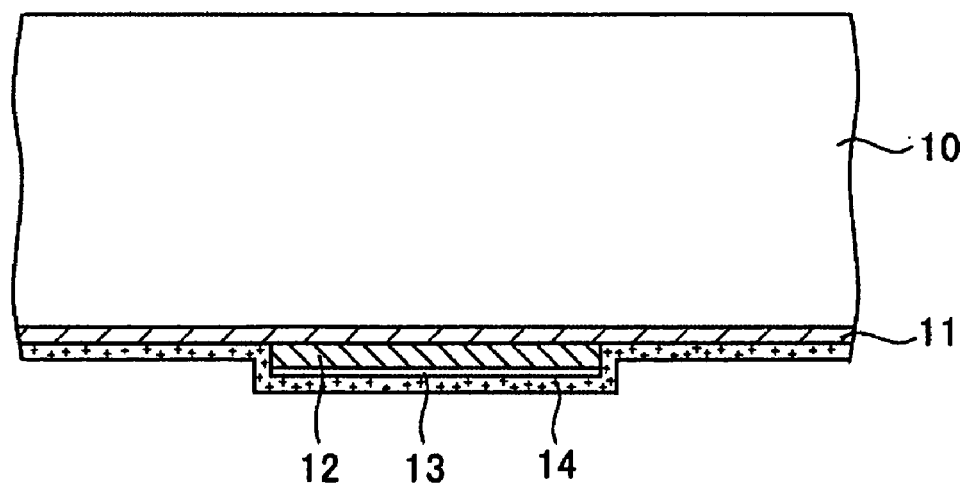

Next, as shown in FIG. 3, the passivation layer 14 as the first protection layer is formed on the front surface of the semiconductor substrate 10, that is, on the pad electrode 12, on the refractory metal layer 13, and on the first insulation film 11 so as to cover these. The passivation layer 14 is formed of, for example, a silicon oxide film ($SiO_2$ film) or a silicon nitride film (SiN film), and formed by a plasma CVD method, for example. The passivation layer 14 preferably has a thickness of about 1 to 2 μm.

The refractory metal layer 13 covered with the passivation layer 14 attaches the passivation layer 14 to the pad electrode 12. Therefore, the pad electrode 12 hardly peels off the passivation layer 14, and is held flat on the front surface of the semiconductor substrate 10 more easily than in the conventional art.

Figure 4:
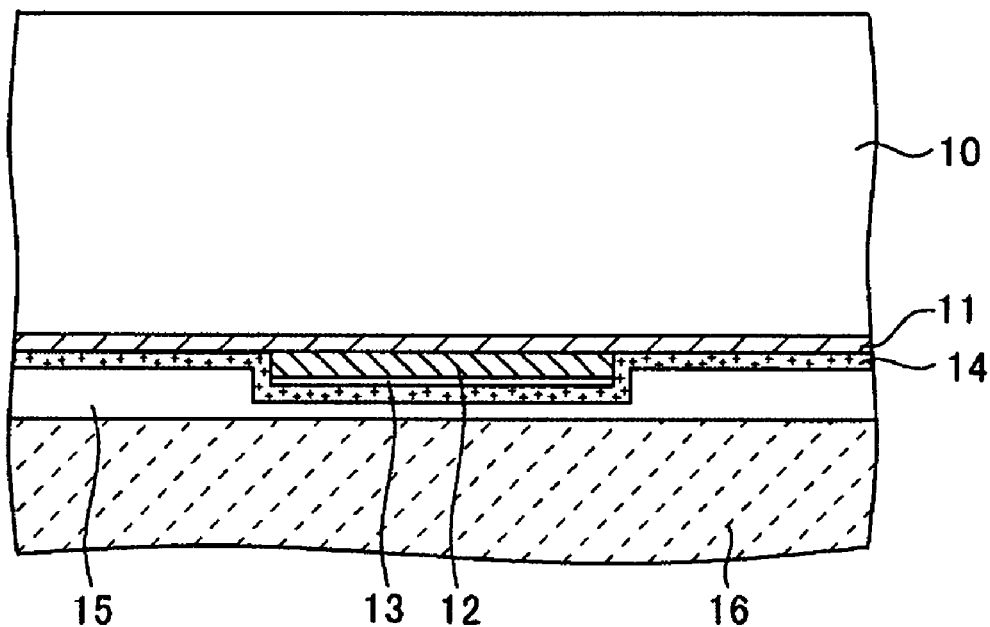

Next, as shown in FIG. 4, a supporting body 16 is attached on the front surface of the semiconductor substrate 10 with a resin layer 15 therebetween. In a case that the electronic device (not shown) is the light receiving element or the light emissive element, the supporting body 16 is formed of a transparent or semitransparent material such as glass, for example. In a case that the electronic device (not shown) is not the light receiving element or the light emissive element, the supporting body 16 is not necessarily formed of a transparent or semitransparent material. The supporting body 16 can form a tape-like shape. Furthermore, this supporting body 16 can be removed in a subsequent process. Alternatively, the supporting body 16 can be left without being removed, or the attachment of the supporting body 16 can be omitted.

Figure 5:
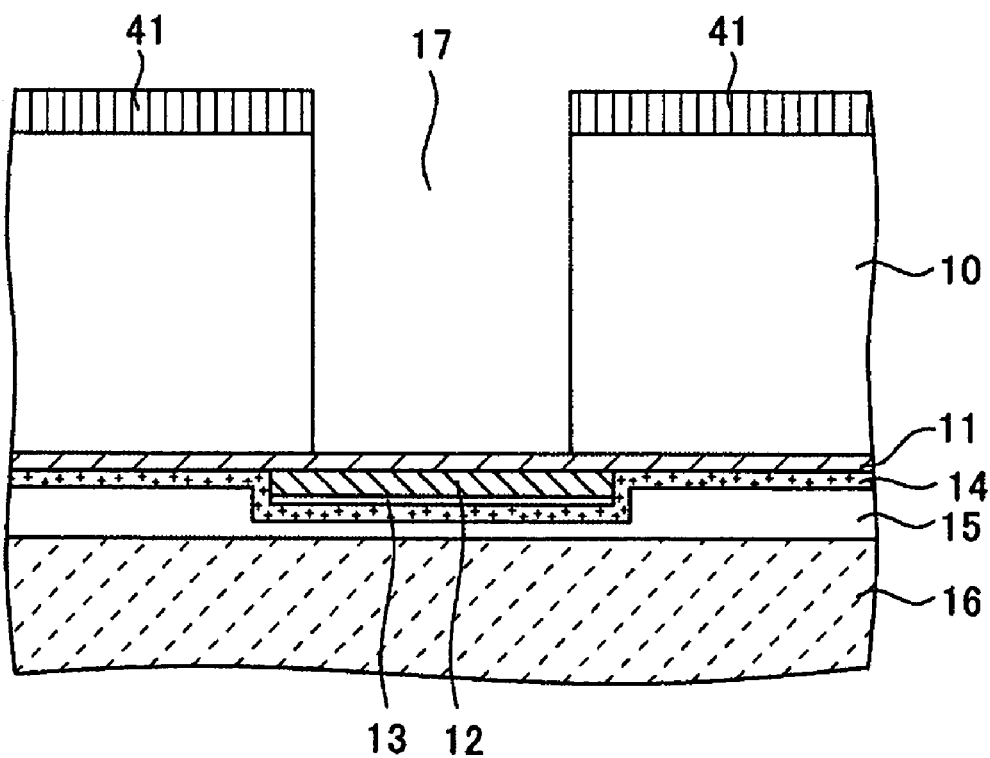

Next, as shown in FIG. 5, a first resist layer 41 is selectively formed on a back surface of the semiconductor substrate 10. That is, the first resist layer 41 has an opening in a position corresponding to the pad electrode 12 on the back surface of the semiconductor substrate 10.

Next, the semiconductor substrate 10 is etched by, preferably, a dry etching using this first resist layer 41 as a mask. As etching gas, gas containing $SF_6$, $O_2$, $C_4F_8$ or the like is used, for example. When $SF_6$ and $O_2$ is used as etching gas, it is preferable to perform the etching under the etching condition of about 1.5 KW of power, 300/30 sccm of gas flow, and 25 Pa of pressure, for example.

By this etching, the via hole 17 penetrating the semiconductor substrate 10 from the back surface to the front surface is formed above the pad electrode 12. The first insulation film 11 is exposed at the bottom of the via hole 17. At this time, the pad electrode 12 being in contact with the first insulation film 11 at the bottom of the via hole 17 is attached to the passivation layer 14 with the refractory metal layer 13 therebetween, and thus held flat on the front surface of the semiconductor substrate 10. Therefore, even when the pad electrode 52 is opposed to the opening of the via hole 17 with the first insulation film 11 therebetween, the deformation of the pad electrode 12 such as projecting into the opening of the via hole 17 as has been seen in the conventional art can be minimized. This can minimize damage or disconnection occurring in the pad electrode 12 by metal fatigue.

Figure 6:
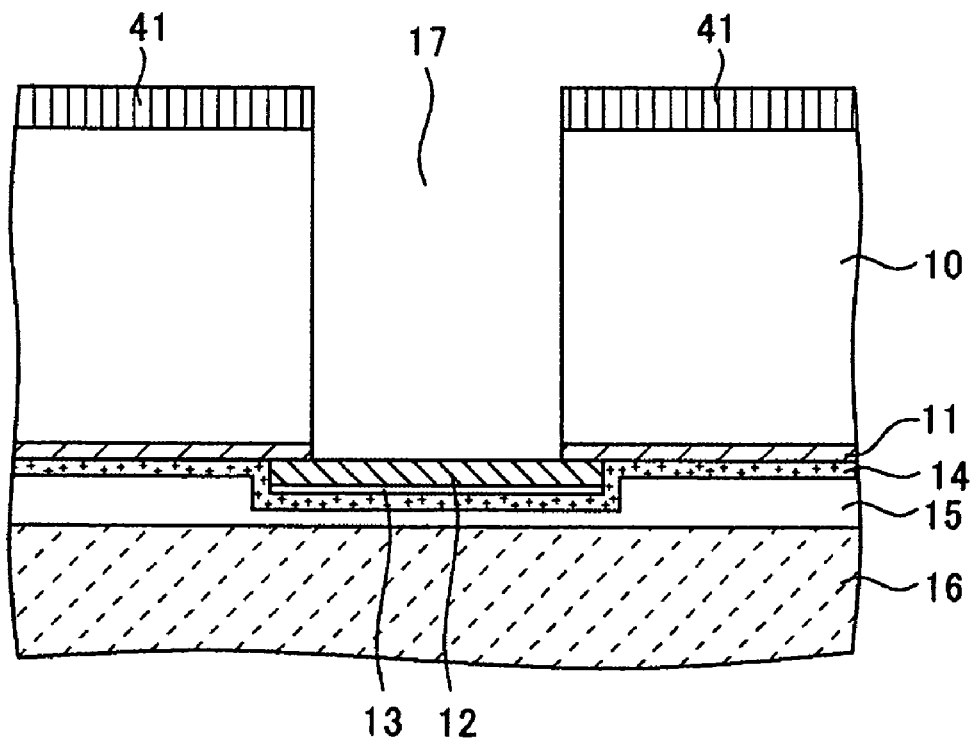

Next, as shown in FIG. 6, a part of the first insulation film 11 exposed at the bottom of the via hole 17 is selectively removed using the first resist layer 41 as a mask. By this process, a part of the pad electrode 12 is exposed at the bottom of the via hole 17. Then, the first resist layer 41 is removed.

Figure 7:
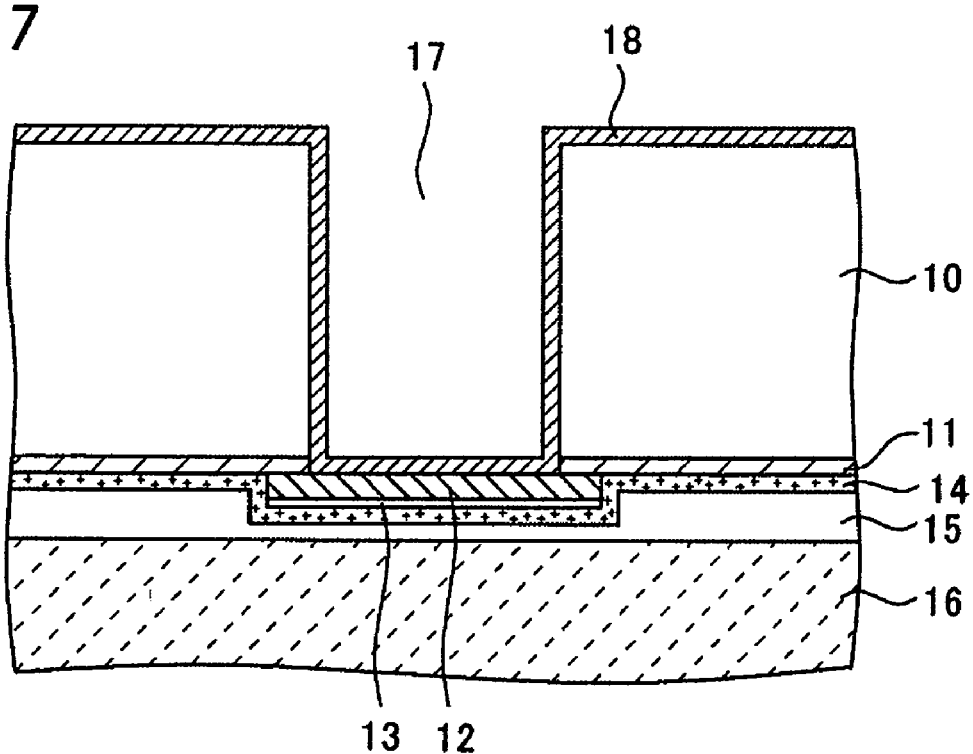

Next, as shown in FIG. 7, a second insulation film 18 is formed on the back surface of the semiconductor substrate 10 including in the via hole 17. The second insulation film 18 is formed of, for example, a silicon oxide film ($SiO_2$ film) or a silicon nitride film (SiN film), and formed by, for example, a plasma CVD method. The second insulation film 18 preferably has a thickness of about 1 to 2 μm.

Figure 8:
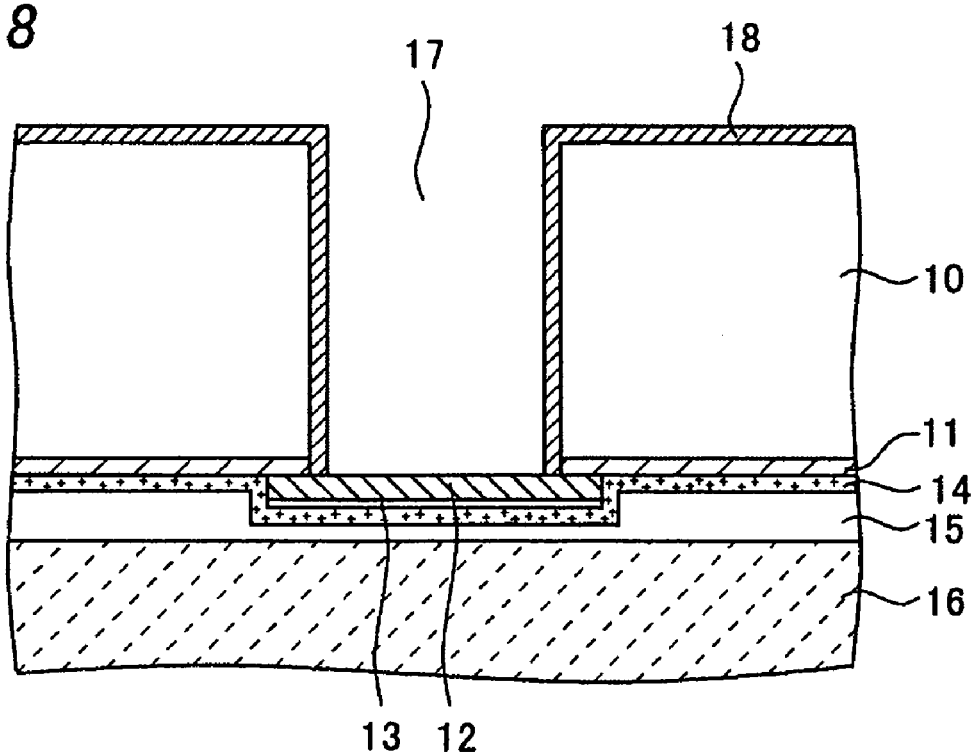

Next, as shown in FIG. 8, the second insulation film 18 is etched from the back surface of the semiconductor substrate 10 by, preferably, an anisotropic dry etching. The second insulation film 18 formed at the bottom of the via hole 17 is thinner than that formed on the back surface of the semiconductor substrate 10, corresponding to the depth of the via hole 17. Therefore, by the described etching, the second insulation film 18 is removed to expose apart of the pad electrode 12 at the bottom of the via hole 17, but the second insulation film 18 remains on the back surface of semiconductor substrate 10 and on the sidewall of the via hole 17.

Figure 9:
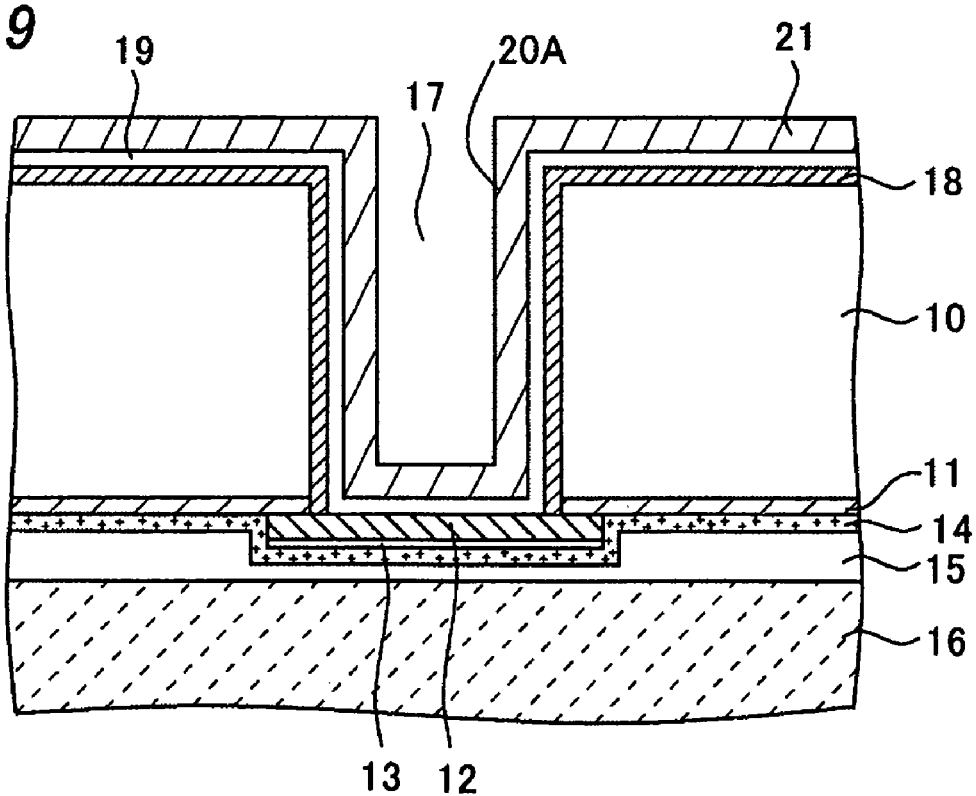

Next, as shown in FIG. 9, a barrier metal layer 19 is formed on the second insulation film 18 in the via hole 17 and on the back surface of the semiconductor substrate 10. The barrier metal layer 19 is formed of a metal layer such as a titanium tungsten (TiW) layer, a titanium nitride (Ti) layer, or a tantalum nitride (TaN) layer, for example.

The barrier metal layer 19 is formed by a sputtering method, a CVD method, an electroless plating method, or the other deposition method, for example. A seed layer (not shown) is formed on this barrier metal layer 19. This seed layer is to be an electrode for forming a wiring layer 21 by plating which will be described below, and formed of metal such as copper (Cu), for example.

In a case that the second insulation film 18 on the sidewall of the via hole 17 is formed of a silicon nitride film (SiN film), the barrier metal layer 19 can be omitted, since the silicon nitride film (SiN film) serves as a barrier against copper diffusion.

Next, a wiring formation layer 20A is formed so as to cover the barrier metal layer 19 and the seed layer formed on the back surface of the semiconductor substrate 10. The wiring formation layer 20A is a metal layer formed of copper (Cu), and formed by an electrolytic plating method, for example.

Figure 10:
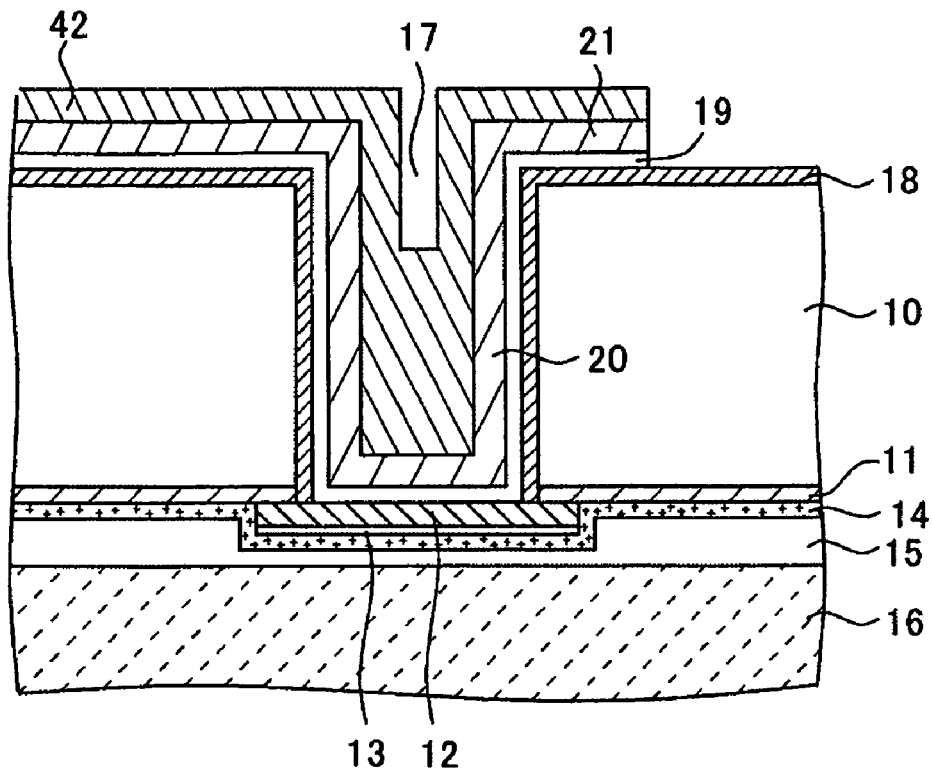

Then, as shown in FIG. 10, a second resist layer 42 is formed on the wiring formation layer 20A in a predetermined region. Then, the wiring formation layer 20A is patterned using the second resist layer 42 as a mask to form a penetrating electrode 20 and a wiring layer 21 continued to and electrically connected with this penetrating electrode 20. A plating thickness is determined to a thickness such that the penetrating electrode 20 does not fill the via hole 17 completely. Alternatively, the penetrating electrode 20 can be formed to fill the via hole 17 completely. It is noted that the predetermined region to be formed with the second resist layer 42 means a region to be formed with the wiring layer 21 having a predetermined pattern, which will be descried below, including a region formed with the via hole 17, on the back surface of the semiconductor substrate 10.

The penetrating electrode 20 is electrically connected with the pad electrode 12 exposed at the bottom of the via hole 17 with the seed layer and the barrier metal layer 19 therebetween. Furthermore, the wiring layer 21 connected with the penetrating electrode 20 is formed on the back surface of the semiconductor substrate 10 with the seed layer and the barrier metal layer 19 therebetween, having a predetermined pattern. Then, after the second resist layer 42 is removed, the barrier metal layer 19 is patterned and removed using the wiring layer 21 and the seed layer as a mask.

It is possible to form the above-described penetrating electrode 20 and wiring layer 21 in different processes, respectively. The formation of the penetrating electrode 20 and the wiring layer 21 can be performed not by the described electrolytic plating method using copper (Cu), but by other deposition methods using other metals. For example, the penetrating electrode 20 and the wiring layer 21 can be formed of aluminum (Al) or aluminum alloy, and formed by a sputtering method. In this case, alter a barrier metal layer (not shown) is formed on the back surface of the semiconductor substrate 10 including the via hole 17, a resist layer (not shown) is formed in a predetermined region on the barrier metal layer excluding the region formed with the via hole 17. Then, the penetrating electrode and the wiring layer formed of the above-mentioned metal are formed by a sputtering method using the resist layer as a mask. Alternatively, the penetrating electrode 20 and the wiring layer 21 can be formed by a CVD method.

Figure 11:
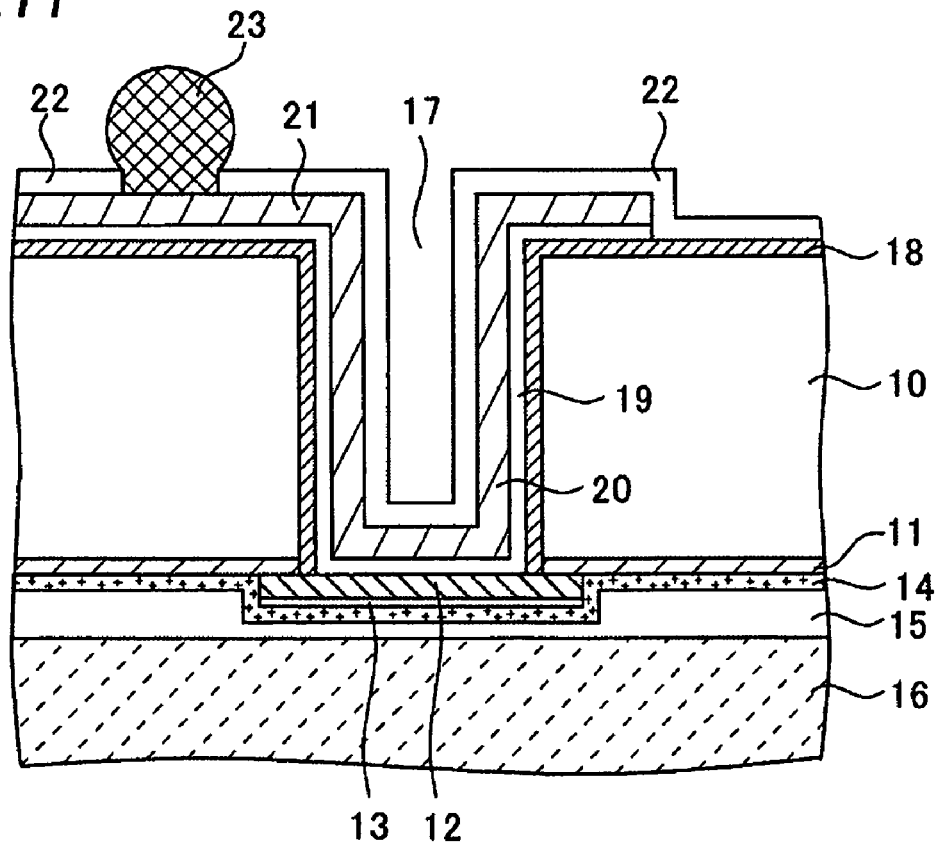

Then, as shown in FIG. 11, a solder resist layer 22 as a second protection layer is formed on the back surface of the semiconductor substrate 10 including in the via hole 17, that is, over the barrier metal layer 19, the penetrating electrode 20, and the wiring layer 21. The solder resist layer 22 is formed of, for example, a resist material and so on. An opening is provided in the solder resist layer 22 in a position corresponding to the wiring layer 21. Then, a ball-shaped conductive terminal 23 formed of, for example, metal such as solder is formed on the wiring layer 21 exposed in the opening.

Figure 12:
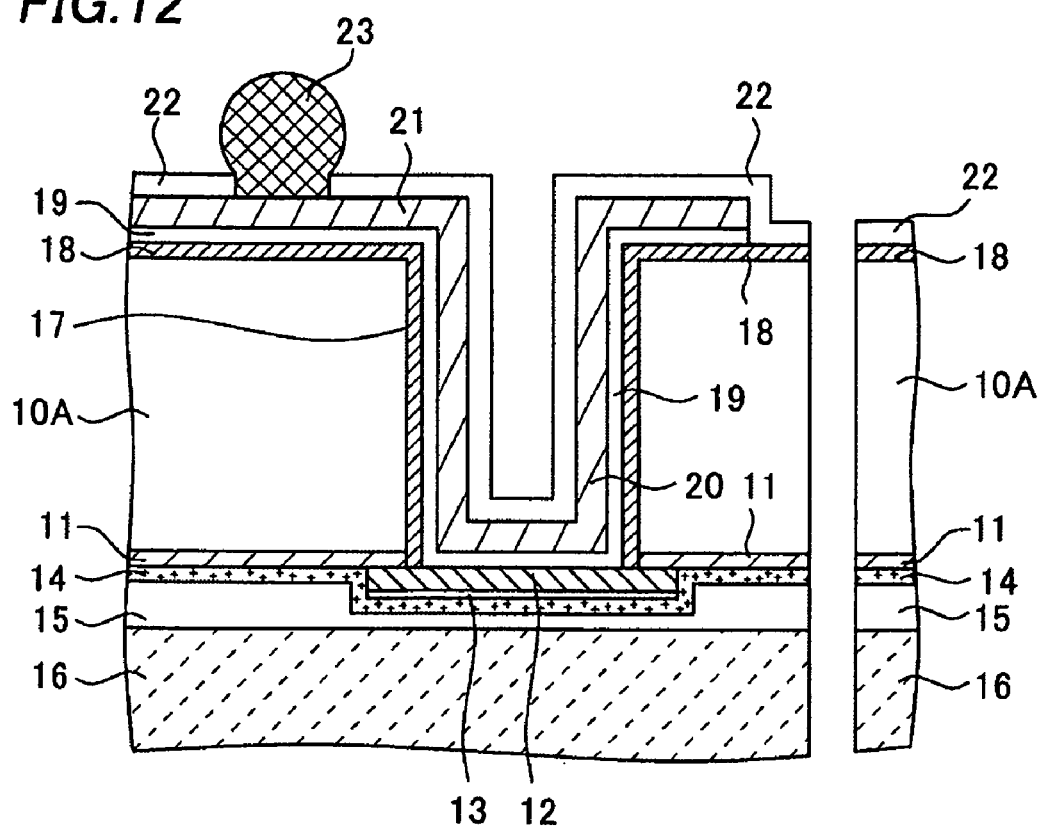

Next, as shown in FIG. 12, the semiconductor substrate 10 is diced along a dicing line (not shown). Then, a plurality of semiconductor devices each formed of a semiconductor die 10A having the penetrating electrode 20 is completed.

As described above, in the semiconductor device and its manufacturing method of the embodiment, the pad electrode 12 at the bottom of the via hole 17 is attached to the passivation layer 14 with the refractory metal layer 13 therebetween and thus held flat on the front surface of the semiconductor die 10A. This can minimize the deformation of the pad electrode 12 such as projecting into the via hole 17 as has been seen in the conventional art, and minimize damage or disconnection occurring in the pad electrode 12 by metal fatigue.

Furthermore, the minimization of the deformation of the pad electrode 12 exposed at the bottom of the via hole 17 prevents connection failure occurring between the pad electrode 12 and the penetrating electrode 20 connected therewith, thereby enhancing reliability in the connection between the penetrating electrode 20 and the pad electrode 12. As a result, the reliability and yield of the semiconductor device having the penetrating electrode 20 can be enhanced.

The above-described embodiment is not limited to the formation of the conductive terminal 23. That is, the conductive terminal 23 is not necessarily formed as long as the penetrating electrode 20 and the wiring layer 21 can be electrically connected with a circuit board (not shown). For example, when the semiconductor device is an LGA (Land Grid Array) type semiconductor device, it is not necessary to form the conductive terminal 23 on the wiring layer 21 in a region partially exposed from the solder resist layer 22.

Furthermore, the described embodiment is not limited to the formation of the wiring layer 21. That is, when the penetrating electrode 20 is formed filling the via hole 17 completely, the wiring layer 21 is not necessarily formed. For example, the penetrating electrode 20 can be directly connected with a circuit board (not shown) without the wiring layer 21 and the conductive terminal 23 therebetween. Alternatively, the penetrating electrode 20 can have the conductive terminal 23 on the penetrating electrode 20 exposed at the opening of the via hole 17, and connected with a circuit board (not shown) with the conductive terminal 23 therebetween and without the wiring layer 21 therebetween.

Figure 13:
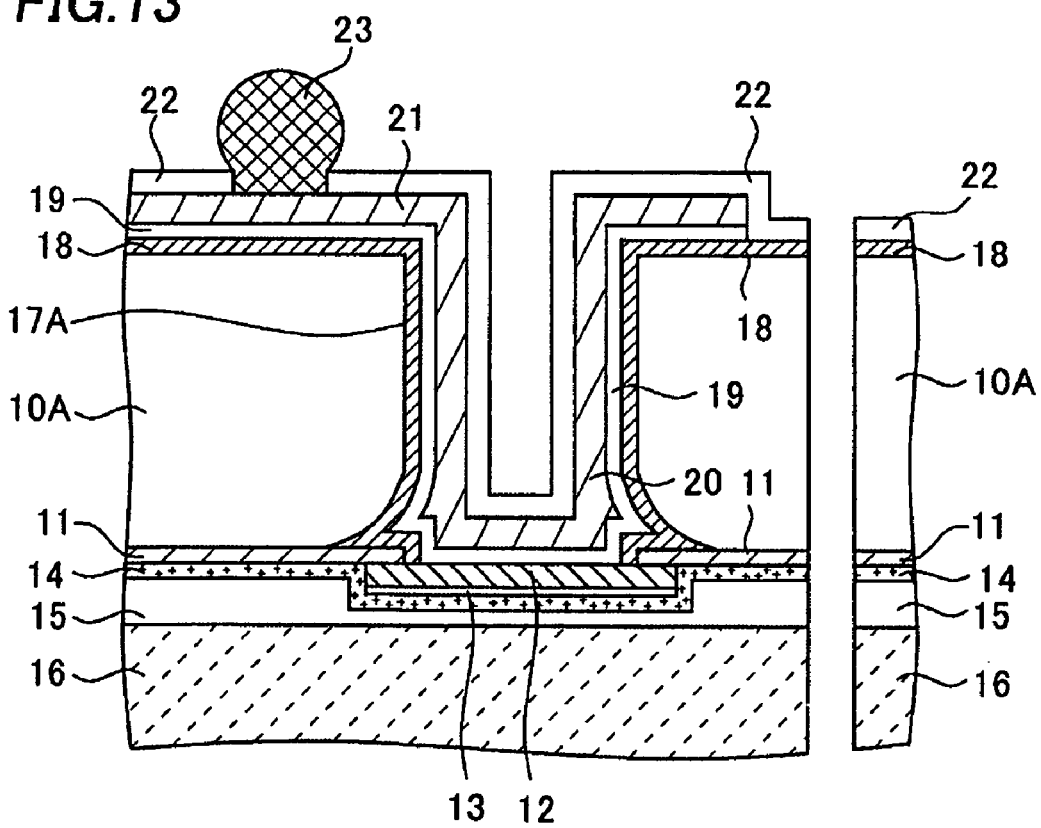

Furthermore, the above-described embodiment can be applied to a case that the via hole 17 is formed to have a larger opening diameter at its bottom than a width of the pad electrode 12. A semiconductor device of the embodiment in this case is shown in FIG. 13.

In a manufacturing process of a semiconductor device, a process of forming the via hole 17A having the descried shape is performed by over-etching the semiconductor substrate 1 under a predetermined condition. By this process, the whole surface (the surface on the side opposed to the via hole 17A) of the pad electrode 12 adjacent to the first insulation film 11 at the bottom of the via hole 17A is opposed to the opening of the via hole 17A with the first insulation film 11 therebetween. An area of the opening of the via hole 17A opposed to the pad electrode 12 is larger than an area of the opening of the via hole 17 opposed to the pad electrode 12 shown in FIG. 12. Therefore, stress accumulated in the pad electrode 12 when the pad electrode 12 is deposited is released from the bottom of the via hole 17A more effectively. This prevents the deformation of the pad electrode 12 such as projecting into the via hole 17A more certainly.

Furthermore, since a rim of the opening of the via hole 17A is not positioned above the pad electrode 12, the deformation of the pad electrode 12 with this rim of the opening as a fulcrum can be prevented. This can minimize damage or disconnection occurring in the pad electrode 12 by metal fatigue.

A semiconductor device manufacturing method of another embodiment of the invention will be described with reference to figures. FIGS. 14 to 26 are cross-sectional views showing the semiconductor device manufacturing method of the embodiment FIGS. 14 to 26 show a portion of a semiconductor substrate near a dicing line (not shown).

Figure 14:
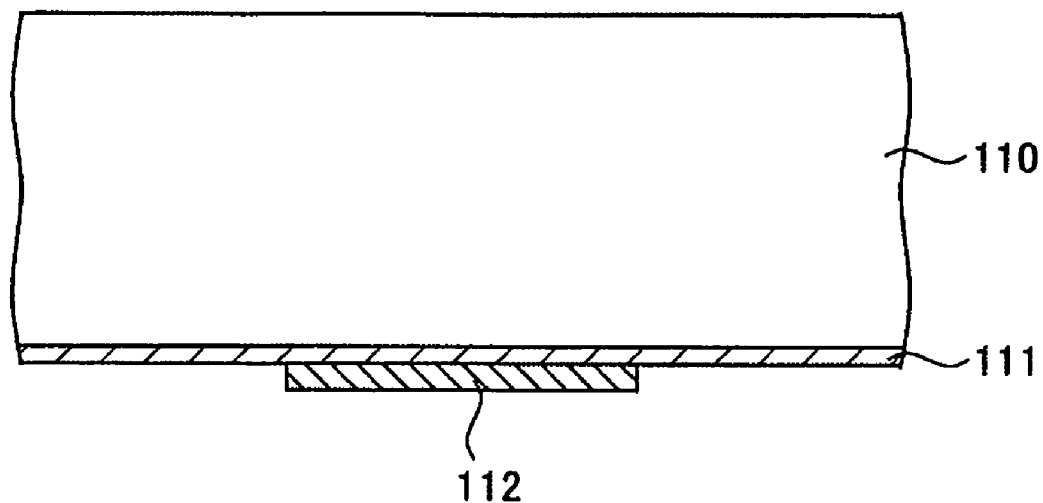
FIGS. 14 to 26 are cross-sectional views for explaining a semiconductor device manufacturing method of another embodiment of the invention.

First, as shown in FIG. 14, a semiconductor substrate 110 formed with an electronic device (not shown) on its front surface is prepared. The electronic device (not shown) is a light receiving element such as a CCD (Charge Coupled Device) or an infrared ray sensor, or a light emissive element, for example. Alternatively, the electronic device (not shown) can be the other electronic device than the light receiving element or the light emissive element. The semiconductor substrate 110 is formed of a silicon substrate, for example, but can be a substrate formed of the other material. The semiconductor substrate 110 preferably has a thickness of about 130 µm.

Next, a first insulation film 111 is formed as an interlayer insulation film on the front surface of the semiconductor substrate 110 including the electronic device (not shown). The first insulation film 111 is formed of, for example, a P-TEOS film or a BPSG film. The first insulation film 111 is formed by a CVD method to have a thickness of about 0.8 µm, preferably.

Furthermore, a pad electrode 112 as an external connection electrode is formed on the first insulation film 111 on the front surface of the semiconductor substrate 110, being connected with the electronic device (not shown). The pad electrode 112 is formed of, for example, aluminum (Al), and preferably has a thickness of about 1 to 2 µm. At this time, the pad electrode 112 is deposited flat, and a predetermined amount of stress (tensile stress or compressive stress) corresponding to a deposition condition is accumulated in the pad electrode 112.

Figure 15:
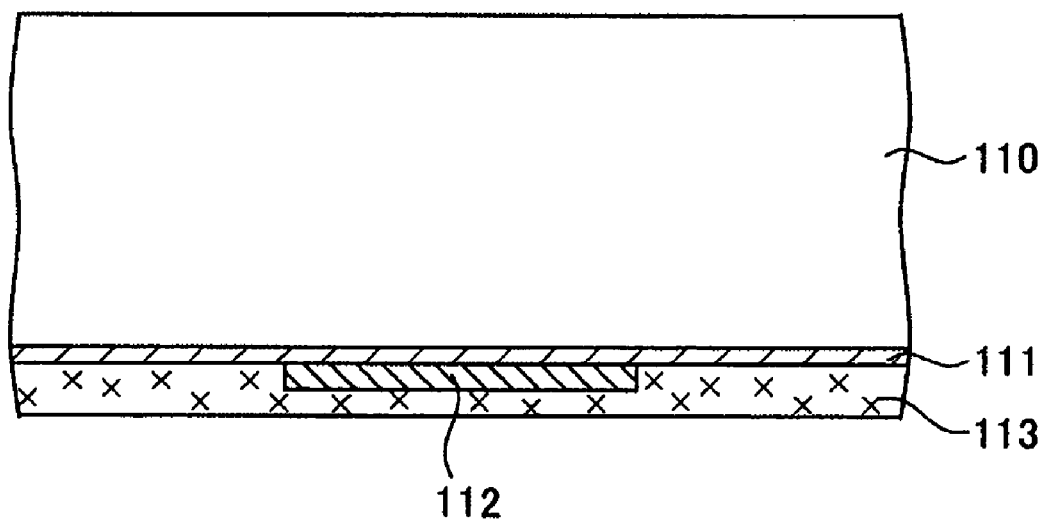

Next, as shown in FIG. 15, a second insulation film 113 is formed on the front surface of the semiconductor substrate 110, that is, on the pad electrode 112 and on the first insulation film 111 so as to cover the pad electrode 112. The second insulation film 113 is formed of, for example, a silicon oxide film ($SiO_2$ film) or a silicon nitride film (SiN film), and formed by, for example, a plasma CVD method. The second insulation film 113 preferably has a thickness of about 0.2 to 1 µm.

Figure 16:
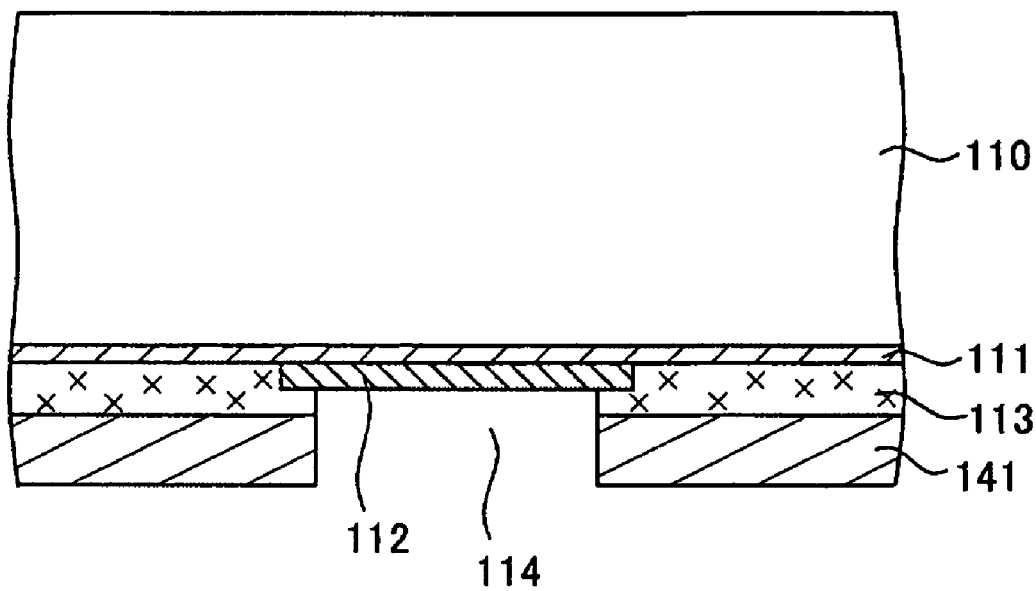

Next, as shown in FIG. 16, a first resist layer 141 is selectively formed in a predetermined region on the second insulation film 113. The predetermined region to be formed with the first resist layer 141 on the second insulation film 113 means a region except a region to be formed with an opening 114 which will be described below, that is, a region on a part of the pad electrode 112 and a region except a region formed with the pad electrode 112.

Next, the second insulation film 113 is selectively etched using the first resist layer 141 as a mask by, preferably, a dry-etching to form the opening 114 opening a part of the second insulation film 113. By this process, the pad electrode 112 is exposed at the bottom of the opening 114.

Figure 17:
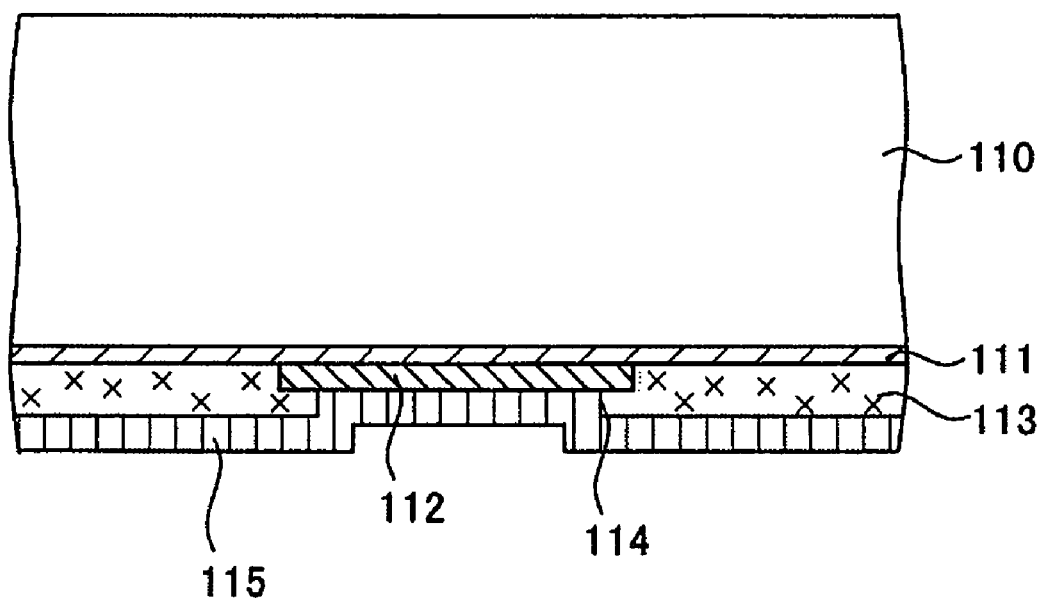

Next, as shown in FIG. 17, after the first resist layer 141 is removed, a first wiring layer 115 is formed on the whole front surface of the semiconductor substrate 110, that is, on the pad electrode 112 exposed at the bottom of the opening 114 and on the second insulation film 113 including in the opening 114. The first wiring layer 115 is electrically connected with the pad electrode 112 exposed at the bottom of the opening 114.

This first wiring layer 115 is formed of copper (Cu) and formed by a sputtering method, for example. The first wiring layer 115 preferably has a thickness of about 0.13 to 3 μm.

Figure 18:
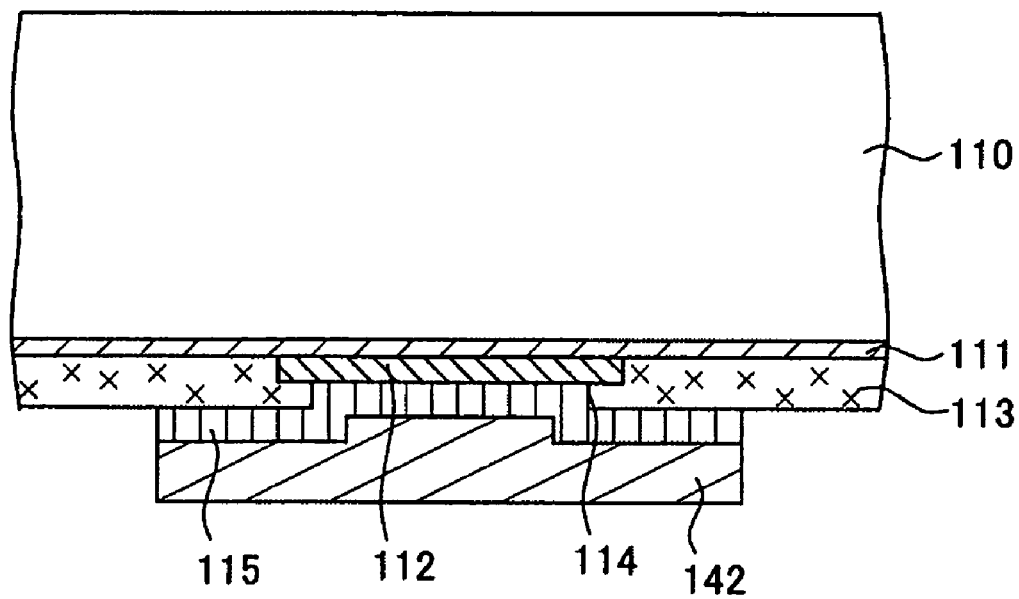

Next, as shown in FIG. 18, a second resist layer 142 is selectively formed in a predetermined region on the first wiring layer 115. The predetermined region to be formed with the second resist layer 142 on the first wiring layer 115 means a region including on a region formed with the opening 114 at least. In this embodiment, the second resist layer 142 is formed on a region formed with the opening 114 and on a region continued from this region near the opening 114.

Next, the first wiring layer 115 is selectively etched using the second resist layer 142 as a mask by, preferably, a dry-etching. By this etching, the first wiring layer 115 is patterned so that its unnecessary portion which is in a region except the region formed with the opening 114 is removed.

This first wiring layer 115 can be also used as an electrode for connecting a probe pin thereto when a circuit test of a semiconductor device is performed, for example.

The described first wiring layer 115 can be formed by the sputtering method using the other metal than copper (Cu). For example, the first wiring layer 115 can be formed by the sputtering method using aluminum (Al).

The first wiring layer 115 can be formed by the other deposition method than the sputtering method. For example, the first wiring layer 115 can be formed of copper (Cu), and formed by a plating method. In this case, after a barrier seed layer (not shown) is formed on the second insulation film 113 including in the opening 114, plating is selectively performed with copper (Cu) using a mask (not shown) to form the first wiring layer 115. Alternatively, the first wiring layer 115 can be formed of copper (Cu), and formed by a damascene method.

Figure 19:
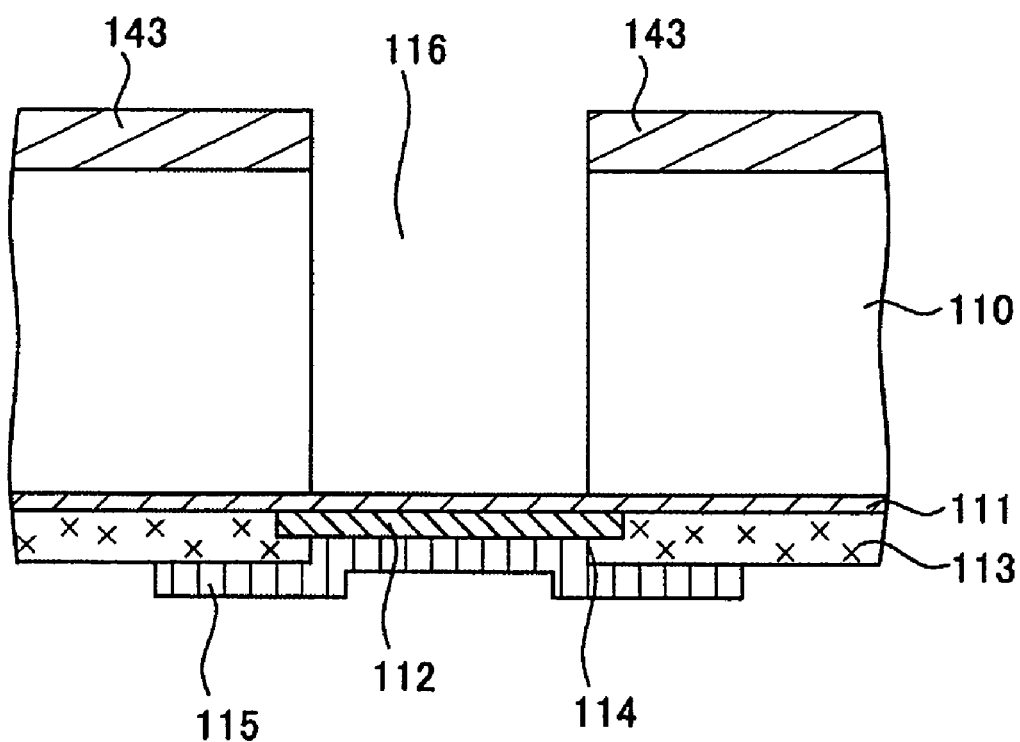

Next, as shown in FIG. 19, after the second resist layer 142 is removed, a third resist layer 143 is selectively formed on the back surface of the semiconductor substrate 110. That is, the third resist layer 143 is formed on the back surface of the semiconductor substrate 110, having an opening in a region corresponding to the pad electrode 112.

Next, the semiconductor substrate 110 is etched using this third resist layer 143 as a mask by, preferably, a dry-etching. As etching gas, gas containing $SF_6O_2$, $C_4F_8$ or the like is used, for example.

When $SF_6$ and $O_2$ is used as etching gas, it is preferable to perform the etching under the etching condition of about 1.5 KW of power, 300/30 sccm of gas flow, and 25 Pa of pressure, for example.

By this etching, the via hole penetrating the semiconductor substrate 110 from the back surface to the front surface is formed above the pad electrode 112. The first insulation film 111 is exposed at the bottom of the via hole 116.

At this time, the via hole 116 and the opening 114 opening the second insulation film 113 are respectively opposed to each side of the pad electrode 112, with the first insulation film 111 and the first wiring layer 115 respectively interposed therebetween. Therefore, stress accumulated in the pad electrode 112 when the pad electrode 112 is deposited is equally released from both the sides of the pad electrode 112. Accordingly, the pad electrode 112 is easily held flat on the front surface of the semiconductor substrate 110.

Figure 20:
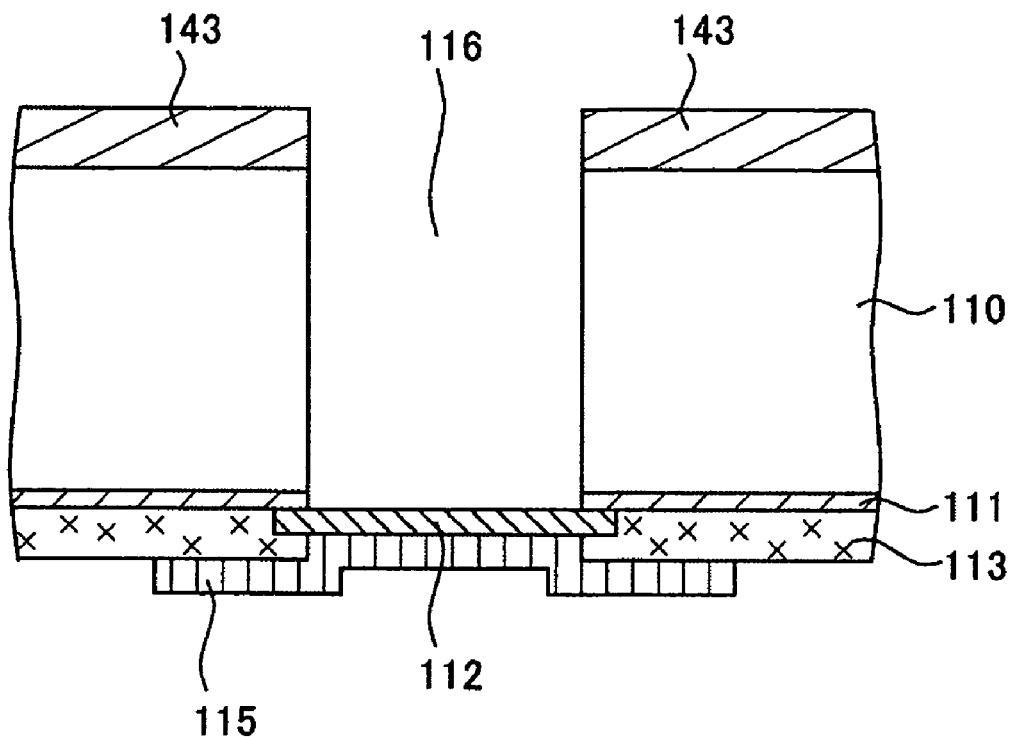

Next, as shown in FIG. 20, a part of the first insulation film 111 exposed at the bottom of the via hole 116 is selectively removed using the third resist layer 143 as a mask. By this process, a part of the pad electrode 112 is exposed at the bottom of the via hole 116. Then, the third resist layer 143 is removed.

Figure 21:
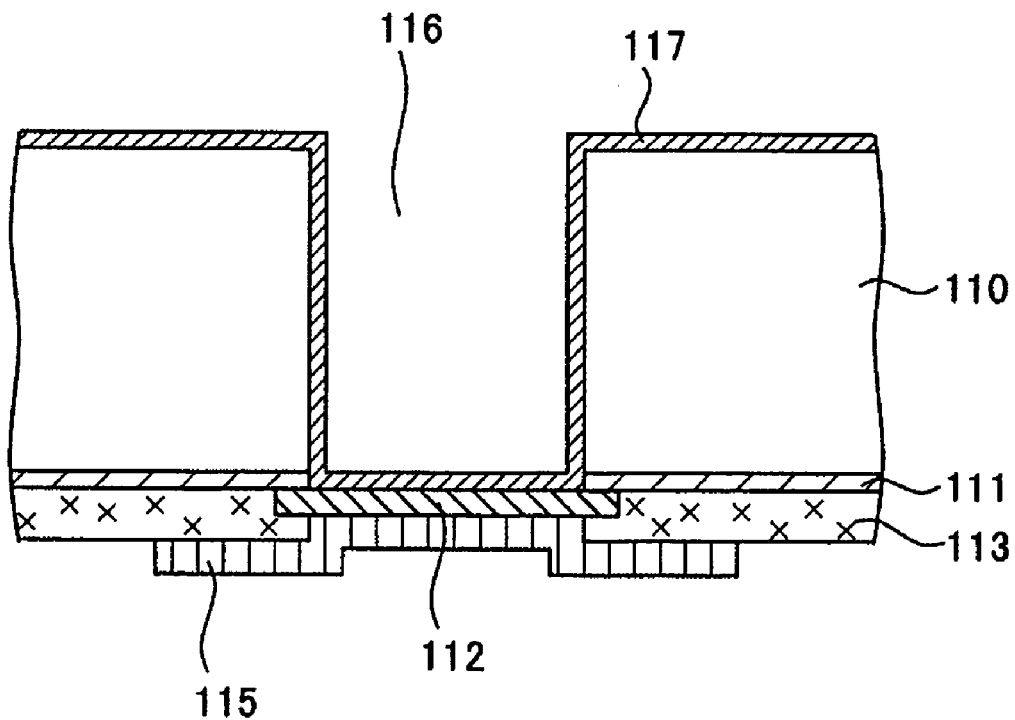

Next, as shown in FIG. 21, a third insulation film 117 is formed on the back surface of the semiconductor substrate 110 including in the via hole 116. The third insulation film 117 is formed of, for example, a silicon oxide film ($SiO_2$ film) or a silicon nitride film (SiN film), and formed by, for example, a plasma CVD method. The third insulation film 117 preferably has a thickness of about 1 to 2 μm.

Figure 22:
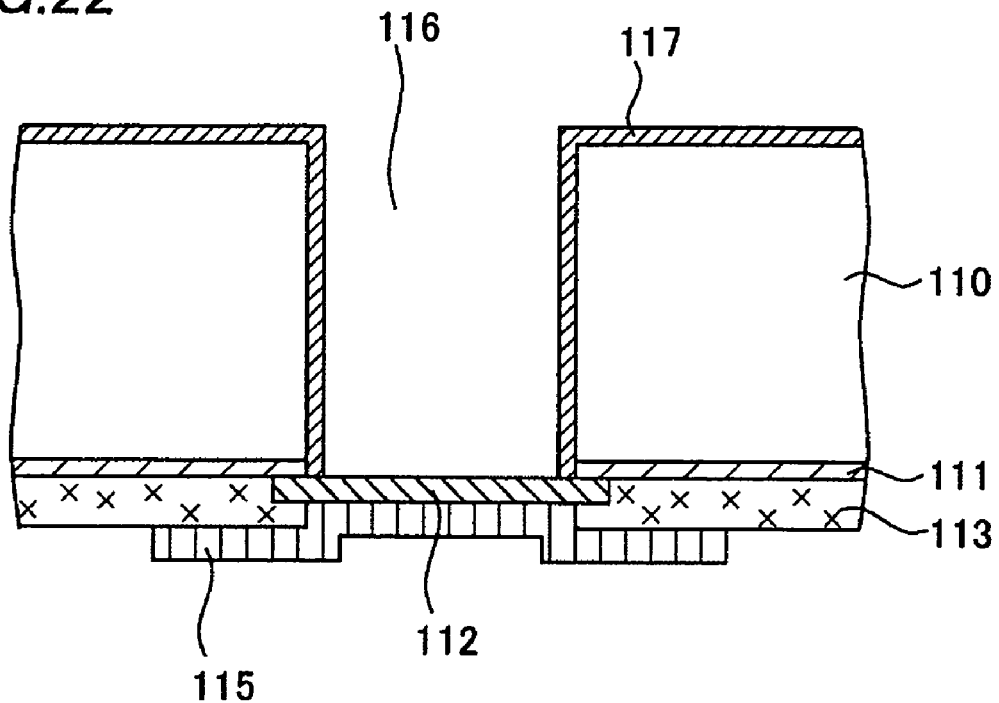

Next, as shown in FIG. 22, the third insulation film 117 is etched from the back surface of the semiconductor substrate 110 by, preferably, an anisotropic dry etching. The third insulation film 117 at the bottom of the via hole 116 is thinner than that formed on the back surface of the semiconductor substrate 110, corresponding to the depth of the via hole 116. Therefore, by the described etching, the third insulation film 117 is removed to expose a part of the pad electrode 112 at the bottom of the via hole 116, but the third insulation film 117 remains on the back surface of the semiconductor substrate 110 and on the sidewall of the via hole 116.

Figure 23:
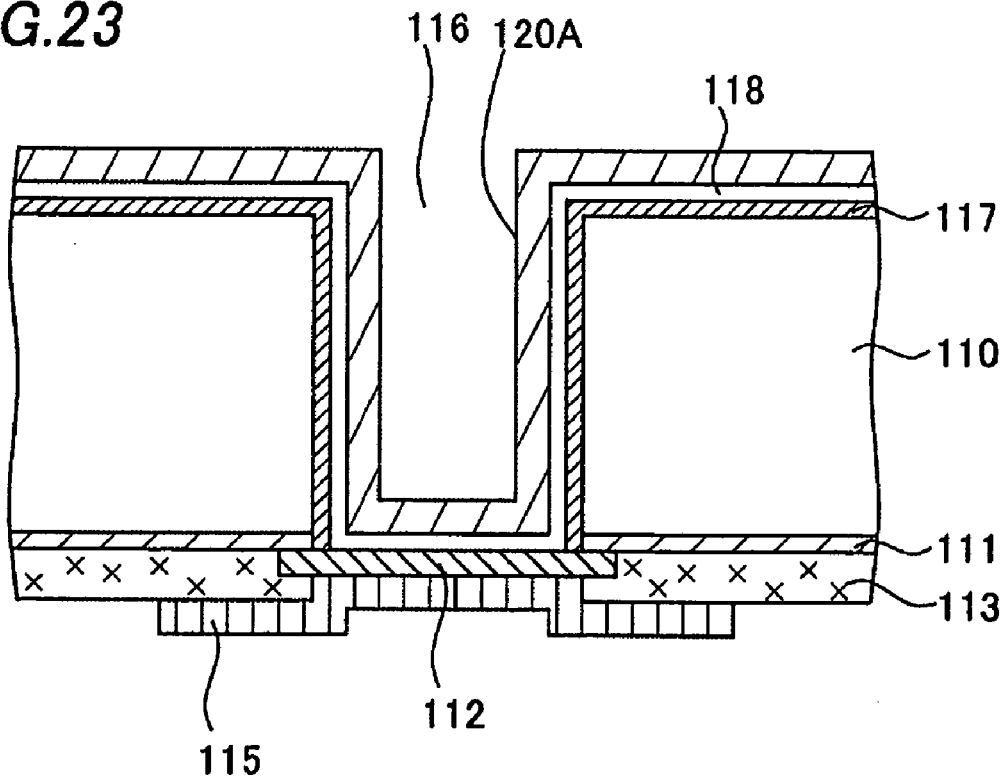

Next, as shown in FIG. 23, a barrier metal layer 118 is formed on the third insulation film 117 in the via hole 116 and on the back surface of the semiconductor substrate 110. The barrier metal layer 118 is formed of a metal layer such as a titanium tungsten (TiW) layer, a titanium nitride (TiN) layer, or a tantalum nitride (TaN) layer, for example.

The barrier metal layer 118 is formed by a sputtering method, a CVD method, an electroless plating method, or the other deposition method, for example.

A seed layer (not shown) is formed on this barrier metal layer 118. This seed layer is to be an electrode for forming a wiring formation layer 120A by plating which will be described below, and formed of metal such as copper (Cu), for example.

In a case that the third insulation film 117 on the sidewall of the via hole 116 is formed of a silicon nitride film (SiN film), the barrier metal layer 118 can be omitted, since the silicon nitride film (SiN film) serves as a barrier against copper diffusion.

Next, the wiring formation layer 120A is formed so as to cover the barrier metal layer 118 and the seed layer formed on the back surface of the semiconductor substrate 110. The wiring formation layer 120A is a metal layer formed of copper (Cu) and formed by an electrolytic plating method, for example.

Figure 24:
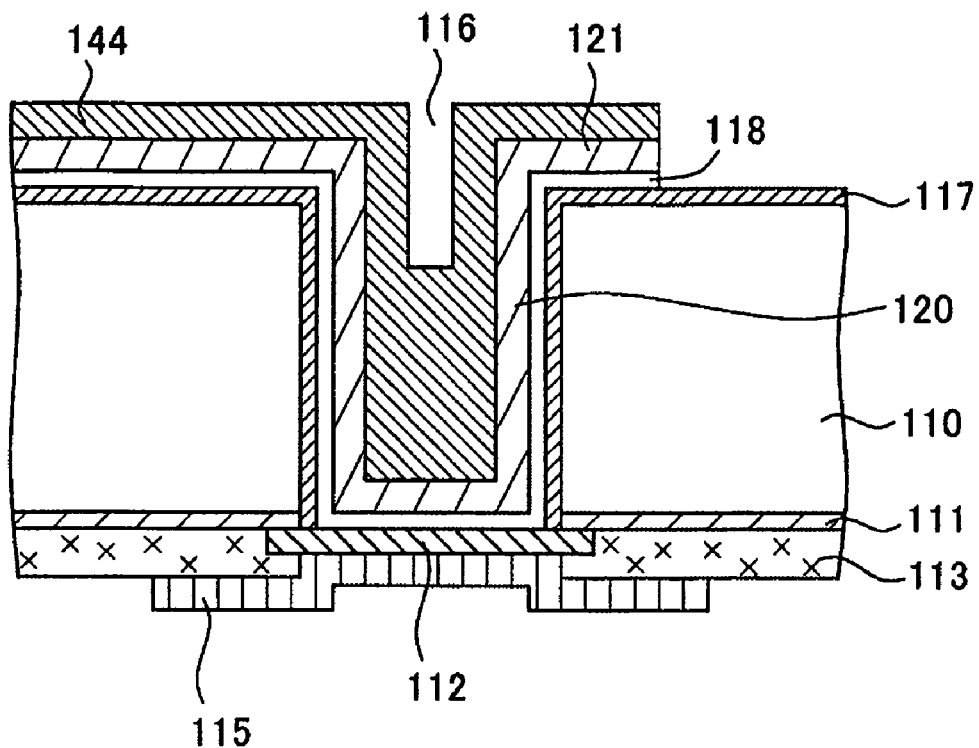

Then, as shown in FIG. 24, a fourth resist layer 144 is formed on the wiring formation layer 120A in a predetermined region. Then, the wiring formation layer 120A is patterned using the fourth resist layer 144 as a mask to form a penetrating electrode 120 and a wiring layer 121 connected with this penetrating electrode 120. A plating thickness is determined to a thickness such that the penetrating electrode 120 does not fill the via hole 116 completely. Alternatively, the penetrating electrode 120 can be formed to fill the via hole 116 completely. It is noted that the predetermined region to be formed with the fourth resist layer 144 means a region to be formed with the wiring layer 121 having a predetermined pattern, which will be descried below, including a region formed with the via hole 116, on the back surface of the semiconductor substrate 110.

The penetrating electrode 120 is electrically connected with the pad electrode 112 exposed at the bottom of the via hole 116 with the seed layer and the barrier metal layer 118 therebetween. The wiring layer 121 electrically connected with the penetrating electrode 120 is formed on the back surface of the semiconductor substrate 110 with the seed layer and the barrier metal layer 118 therebetween, having a predetermined pattern. Then, after the fourth resist layer 144 is removed, the barrier metal layer 118 is patterned and removed using the wiring layer 121 and the seed layer as a mask.

It is possible to form the above-described penetrating electrode 120 and wiring layer 121 in different processes, respectively. The formation of the penetrating electrode 120 and the wiring layer 121 can be performed not by the described electrolytic plating method using copper (Cu), but by the other deposition method using the other metal. For example, the penetrating electrode 120 and the wiring layer 121 can be formed of aluminum (Al) or aluminum alloy, and formed by a sputtering method. In this case, after a barrier metal layer (not shown) is formed on the back surface of the semiconductor substrate 110 including the via hole 16, the penetrating electrode and the wiring layer formed of the above-mentioned metal are formed on the barrier metal layer by the sputtering method. Then, a resist layer (not shown) is formed in a predetermined region on the wiring layer excluding the region formed with the via hole 116. Then, the wiring layer is patterned using the resist layer as a mask. Alternatively, the penetrating electrode 120 and the wiring layer 121 can be formed by a CVD method.

Figure 25:
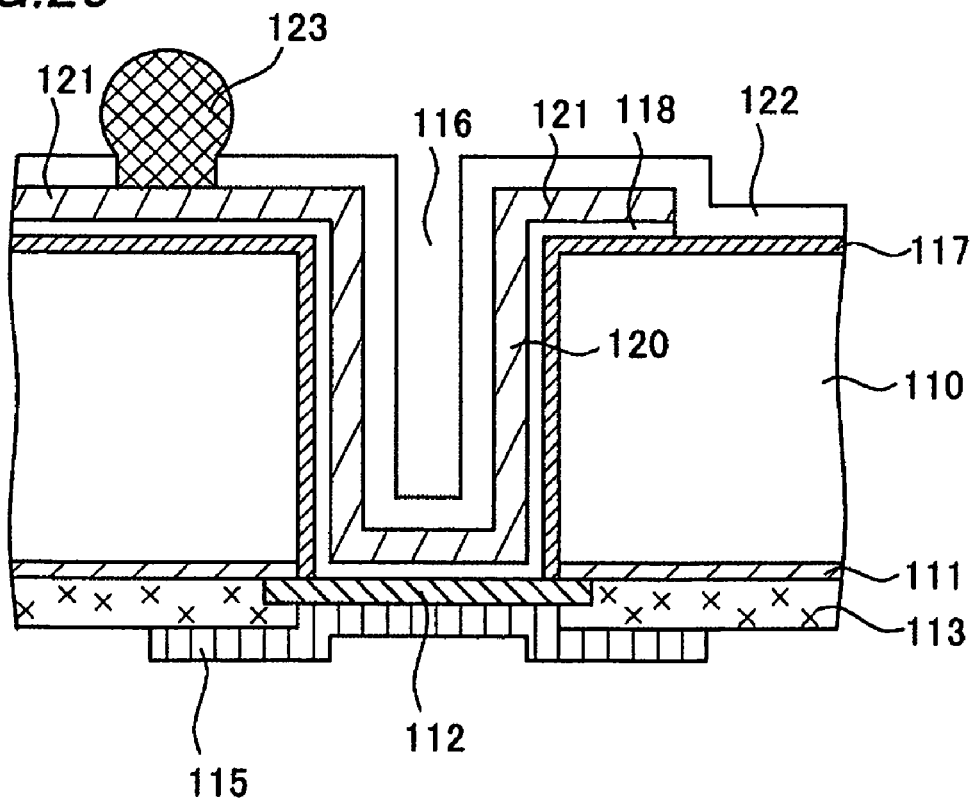

Then, as shown in FIG. 25, a protection layer 122 is formed on the back surface of the semiconductor substrate 110 including in the via hole 116, that is, over the third insulation film 117, the penetrating electrode 120, and the wiring layer 121. The protection layer 122 is formed of, for example, a resist material. An opening is provided in the protection layer 122 in a position corresponding to the wiring layer 121. Then, a ball-shaped conductive terminal 123 formed of, for example, metal such as solder is formed on the wiring layer 121 exposed in the opening.

Figure 26:
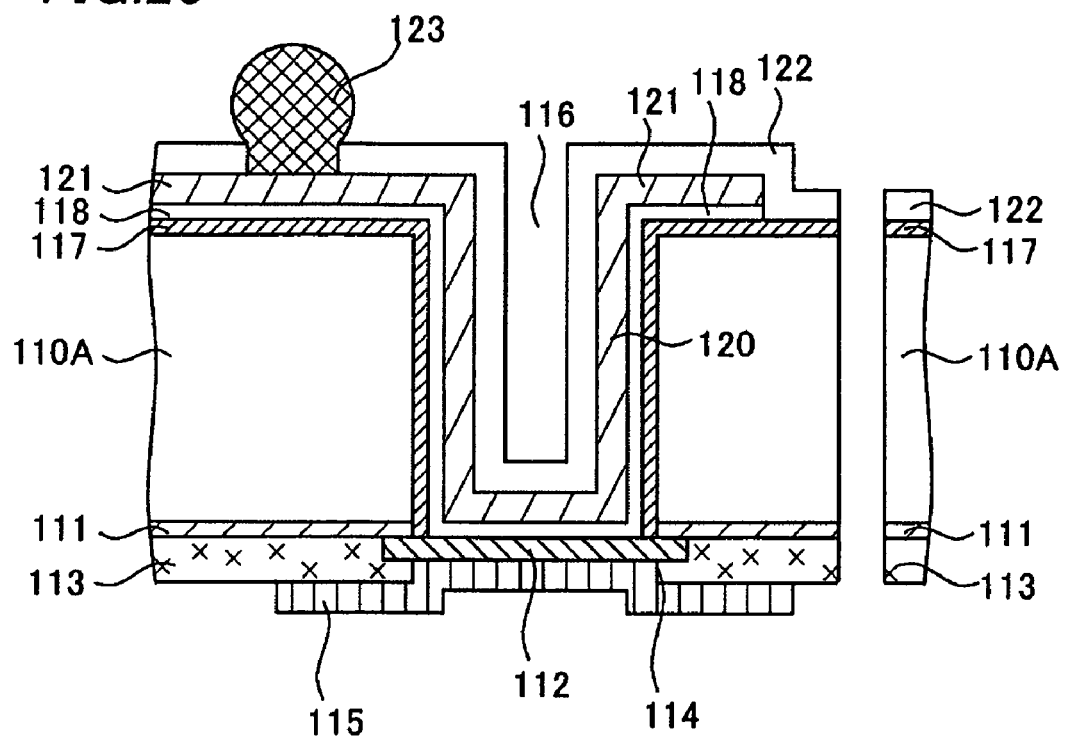
Figure 27:
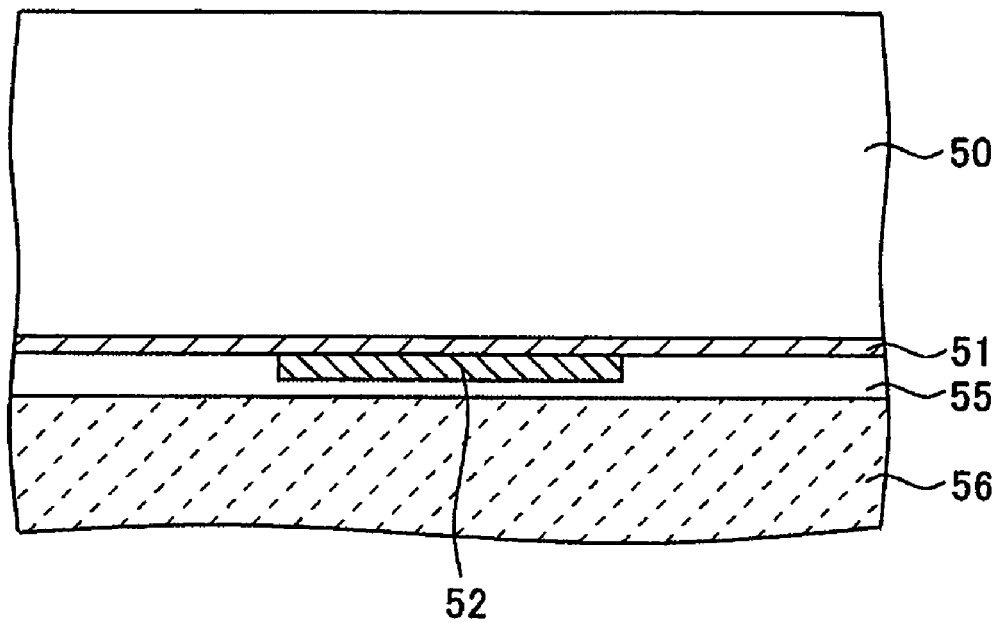
FIGS. 27 and 28 are cross-sectional views showing a conventional semiconductor device manufacturing method.
Figure 28:
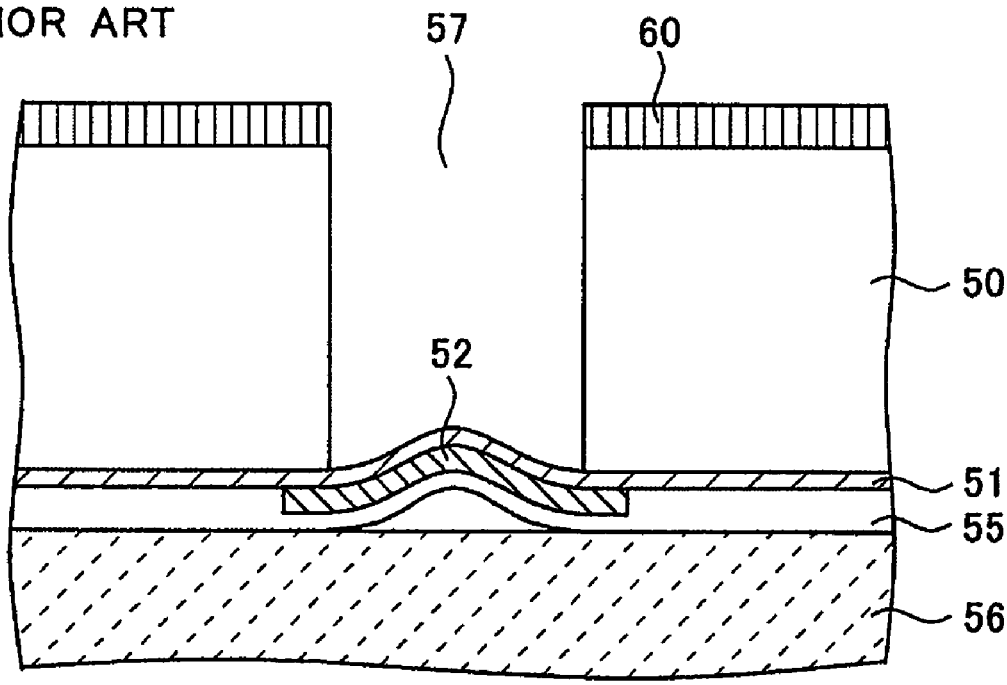

Next, as shown in FIG. 26, the semiconductor substrate 110 is diced along a dicing line (not shown). Then, a plurality of semiconductor devices each formed of a semiconductor die 110A having the penetrating electrode 120 is completed.

As described above, in the semiconductor device and its manufacturing method of the embodiment, the via hole 116 formed from the back surface of the semiconductor substrate 110 to the pad electrode 112 and the opening 114 formed on the front surface side of the semiconductor substrate 110 and opening the second insulation film 113 are opposed to each side of the pad electrode 112. That is, both the sides of the pad electrode 112 are open to the opening 114 and the via hole 116. Therefore, stress accumulated in the pad electrode 112 when the pad electrode 112 is deposited is equally released from both the sides of the pad electrode 112.

Accordingly, the pad electrode 112 is easily held flat on the front surface of the semiconductor die 110A (semiconductor substrate 110). That is, the deformation of the pad electrode 112 as has been seen in the conventional art can be minimized.

Furthermore, the minimization of the deformation of the pad electrode 112 prevents connection failure occurring between the pad electrode 112 and the penetrating electrode 120 connected therewith at the bottom of the via hole 116, thereby enhancing reliability in the connection between the penetrating electrode 120 and the pad electrode 112. As a result, the reliability and yield of the semiconductor device having the penetrating electrode can be enhanced.

The above-described embodiment is not limited to the formation of the conductive terminal 123. That is, the conductive terminal 123 is not necessarily formed as long as the penetrating electrode 120 and the wiring layer 121 can be electrically connected with a circuit board (not shown). For example, when the semiconductor device is an LGA (Land Grip Array) type semiconductor device, it is not necessary to form the conductive terminal 123 on the wiring layer 121 in a region partially exposed from the protection layer 122.

Furthermore, the described embodiment is not limited to the formation of the wiring layer 121. That is, when the penetrating electrode 120 is formed filling the via hole 116 completely, the wiring layer 121 is not necessarily formed. For example, the penetrating electrode 120 can be directly connected with a circuit board (not shown) without the wiring layer 121 and the conductive terminal 123 therebetween. Alternatively, the penetrating electrode 120 can have the conductive terminal 123 on the penetrating electrode 120 exposed at the opening of the via hole 116, and connected with a circuit board (not shown) with the conductive terminal 123 therebetween and without the wiring layer 121 therebetween.

Although the opening 114 and the via hole 116 have opening diameters smaller than the pad electrode 112 in this embodiment, these diameters can be larger than the pad electrode 112. In the embodiment the openings are formed to have almost the same diameters as each other on the sides of the semiconductor substrate respectively.

Furthermore, since the embodiment uses a structure having the wiring layers 115 and 121 on the upper and lower sides, the embodiment is effective for forming a semiconductor device having a stack structure laminated with the semiconductor device of the invention.

What is claimed is:

1. A semiconductor device comprising:
   a semiconductor die;
   a pad electrode disposed on a front surface of the semiconductor die;
   a refractory metal layer disposed on the pad electrode;
   a first protection layer disposed on the front surface of the semiconductor die so that the refractory metal layer is placed between the pad electrode and the first insulating protection layer; and
   a penetrating electrode disposed in a via hole and electrically connected with the pad electrode, the via hole being formed from a back surface of the semiconductor die toward the pad electrode,
   wherein the first insulating protection layer overlaps an end of the via hole on which the pad electrode is disposed.

2. The semiconductor device of claim 1, wherein the refractory metal layer is made of titanium, a titanium alloy, tantalum, a tantalum alloy, tungsten, or a tungsten alloy.

3. The semiconductor device of claim 1, further comprising a wiring layer electrically connected with the penetrating electrode and extending onto the back surface of the semiconductor die, and a second protection layer formed on the back surface of the semiconductor die so as to cover at least part of the wiring layer.

4. The semiconductor device of claim 3, further comprising a conductive terminal disposed on the wiring layer not covered by the second protection layer.

5. A semiconductor device comprising:
a semiconductor die;
a first insulation film disposed a front surface of the semiconductor die;
a pad electrode disposed on part of the first insulation film;
a second insulation film disposed on the front surface so as to be on the first insulation film so that an edge portion of the pad electrode is placed between the first and second insulation films;
a first wiring layer in contact with the pad electrode through an opening formed in the second insulation film, the first wiring layer extending onto the second insulation film; and
a penetrating electrode disposed in a via hole and electrically connected with the pad electrode, the via hole being formed from a back surface of the semiconductor die toward the pad electrode so that the pad electrode overlaps an end of the via hole at the front surface of the semiconductor die.

6. A semiconductor device comprising:
a semiconductor die;
a first insulation film disposed a front surface of the semiconductor die;
a pad electrode disposed on part of the first insulation film;
a second insulation film disposed on the front surface so as to be on the first insulation film so that an edge portion of the pad electrode is between the first and second insulation films;
a first wiring layer in contact with the pad electrode through an opening formed in the second insulation film, the first wiring layer extending onto the second insulation film;
a penetrating electrode disposed in a via hole and electrically connected with the pad electrode, the via hole being formed from a back surface of the semiconductor die toward the pad electrode;
a second wiring layer electrically connected with the penetrating electrode and extending onto the back surface of the semiconductor die; and
a protection layer formed on the back surface of the semiconductor die so as to cover at least part of the second wiring layer.

7. The semiconductor device of claim 6, further comprising a conductive terminal disposed on the part of the second wiring layer not covered by the protection layer.

8. The semiconductor device of claim 1, further comprising a supporting body disposed on the front surface of the semiconductor die.

9. The semiconductor device of claim 8, wherein the supporting body is made of a glass or a tape.

10. The semiconductor device of claim 5, wherein a lateral size of the pad electrode is larger than a lateral size of the via hole.

* * * * *